(12) United States Patent
Achkire et al.

(10) Patent No.: US 6,957,749 B2
(45) Date of Patent: *Oct. 25, 2005

(54) LIQUID DELIVERY SYSTEM

(75) Inventors: Younes Achkire, Los Gatos, CA (US); Jonathan S Frankel, San Jose, CA (US); Brian J Brown, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/452,798

(22) Filed: May 30, 2003

(65) Prior Publication Data

US 2004/0000377 A1 Jan. 1, 2004

Related U.S. Application Data

(63) Continuation-in-part of application No. 09/729,128, filed on Dec. 1, 2000, now Pat. No. 6,749,086.
(60) Provisional application No. 60/384,548, filed on May 31, 2002.

(51) Int. Cl.$^7$ .............................. B67D 5/00; B67D 5/56; C23C 16/00
(52) U.S. Cl. ...................... 222/3; 222/192.2; 118/719; 141/83
(58) Field of Search .............................. 141/83, 2, 18; 222/3, 129.2; 118/719

(56) References Cited

U.S. PATENT DOCUMENTS

| | | | |
|---|---|---|---|
| 5,417,346 A | 5/1995 | Ferri, Jr. et al. | |
| 5,478,435 A | 12/1995 | Murphy et al. | |
| 5,750,440 A | 5/1998 | Vanell et al. | |
| 5,857,893 A | 1/1999 | Olsen et al. | |
| 6,098,843 A | 8/2000 | Soberanis et al. | |
| 6,186,745 B1 * | 2/2001 | Johnson | 417/54 |
| 6,199,599 B1 | 3/2001 | Gregg et al. | |
| 6,286,566 B1 * | 9/2001 | Cline et al. | 141/83 |
| 6,749,086 B2 * | 6/2004 | Achkire et al. | 222/3 |

* cited by examiner

Primary Examiner—P. Hassanzadel
Assistant Examiner—Sylvia R. MacArthur
(74) Attorney, Agent, or Firm—Dugan & Dugan (57) ABSTRACT

In a first aspect, a liquid delivery system is provided that includes a first liquid delivery module adapted to store and dispense a first chemical and a second liquid delivery module adapted to store and dispense a second chemical. The liquid delivery system further includes at least one connecting mechanism coupled to the first and second delivery modules and adapted to couple the first and second delivery modules to a substrate processing device. Each delivery module includes a vessel including a first chamber and a second chamber. The vessel is configured to receive a liquid from a bulk supply and to receive a pressurized flow of gas from a gas source. Each liquid delivery module also includes a valve assembly operable to selectively permit fluid communication between the first chamber and the second chamber during a non-refill state and to prevent fluid communication between the first chamber and the second chamber during a refill state.

8 Claims, 7 Drawing Sheets

| Energized Valves | Spray bar A (Front) | Spray bar B (Back) |
|---|---|---|
| 598, 602 | DIW | Chem I |
| 598, 606, 610 | Chem I | Chem I |
| 620, 622 | DIW | Chem II |
| 620, 622, 610 | Chem II | Chem II |
| 620, 622, 598, 602 | DIW | Chem I+Chem II |
| 620, 622, 598, 602, 610 | Chem II | Chem I+Chem II |
| 620, 622, 598, 606, 610 | Chem I+Chem II | Chem I+Chem II |

FIG. 5 ly between the first chamber and the second chamber during a non-refill state and to prevent fluid communication between the first chamber and the second chamber during a refill state.

LIQUID DELIVERY SYSTEM

The present application claims priority from U.S. provisional patent application Ser. No. 60/384,548, filed May 31, 2002, and is a continuation-in-part of U.S. non-provisional patent application Ser. No. 09/729,128, filed Dec. 1, 2000 now U.S. Pat. No. 6,749,086, entitled "Pressurized Liquid Delivery Module". Both of these patent applications are hereby incorporated by reference herein in their entirety.

FIELD OF THE INVENTION

This invention is concerned with semiconductor manufacturing, and is more particularly concerned with cleaning of semiconductor substrates.

BACKGROUND OF THE INVENTION

Chemical-mechanical polishing ("CMP") is a commonly used technique for planarizing material on a semiconductor wafer. CMP often requires introduction of a polishing slurry as the wafer is being mechanically polished against a rotating polishing pad. Slurries typically are water based and can contain fine abrasive particles such as silica, alumina, and other abrasive materials. After CMP is complete, the wafers are exposed to cleaning chemistries to remove residual slurry and other residue in order to prepare the wafer for subsequent fabrication utilizing techniques such as etching, photolithography, ion-implantation and the like.

Cleaning chemistries may be delivered to the post-CMP wafer cleaner directly from a bulk supply of a particular fabrication facility. However, the flow of cleaning chemistry from the bulk supply may vary depending upon demands placed upon the bulk supply by other post-CMP cleaning systems.

Therefore, liquid delivery modules having a cleaning chemistry storage capacity are frequently employed to dispense cleaning chemistry for post-CMP wafer cleaning. This configuration renders the flow of cleaning chemistry to the post-CMP cleaning tool essentially independent of the flow of cleaning chemistry from the bulk supply.

Because of the need for rapid throughput of polished wafers to be cleaned, it is desirable that the liquid delivery module provide a continuous flow of cleaning chemistry, interrupted only by the transfer of a cleaned wafer out of the cleaner and the loading of the next wafer to be cleaned. In addition, due to space considerations and the need for ease of servicing, it is desirable that the liquid delivery module occupy as little space as possible, and also that the design of the liquid delivery module be relatively simple to permit ready access to various components of the device. Accordingly, new compact and simple designs for liquid delivery modules to dispense fluids utilized in semiconductor fabrication process are desirable.

It is also sometimes desirable that two different chemicals be selectively mixed and/or delivered to respective sides of a wafer.

SUMMARY OF THE INVENTION

According to an aspect of the invention, a liquid delivery system is provided. The inventive liquid delivery system includes a first liquid delivery module adapted to store and dispense a first chemical and a second liquid delivery module adapted to store and dispense a second chemical. The inventive liquid delivery system further includes at least one connecting mechanism coupled to the first and second delivery modules and adapted to couple the first and second delivery modules to a substrate processing device. Further in accordance with this aspect of the invention, each of the liquid delivery modules includes a vessel including a first chamber and a second chamber. The vessel is configured to receive a liquid from a bulk supply and to receive a pressurized flow of gas from a gas source. Each liquid delivery module also includes a valve assembly operable to selectively permit fluid communication between the first chamber and the second chamber during a non-refill state and to prevent fluid communication between the first chamber and the second chamber during a refill state.

With the inventive liquid delivery system, substantially continuous supply of two chemicals and/or a mixture of the two chemicals, may be provided to a substrate processing device such as a scrubber module, where the flow of chemicals is interrupted only by transfer of a processed wafer out of the substrate processing device and loading of the next wafer to be processed.

Other features and advantages of the present invention will become more fully apparent from the following detailed description of the preferred embodiments, the appended claims and the accompanying drawings.

DESCRIPTION OF THE SPECIFIC EMBODIMENTS

Figure 1:
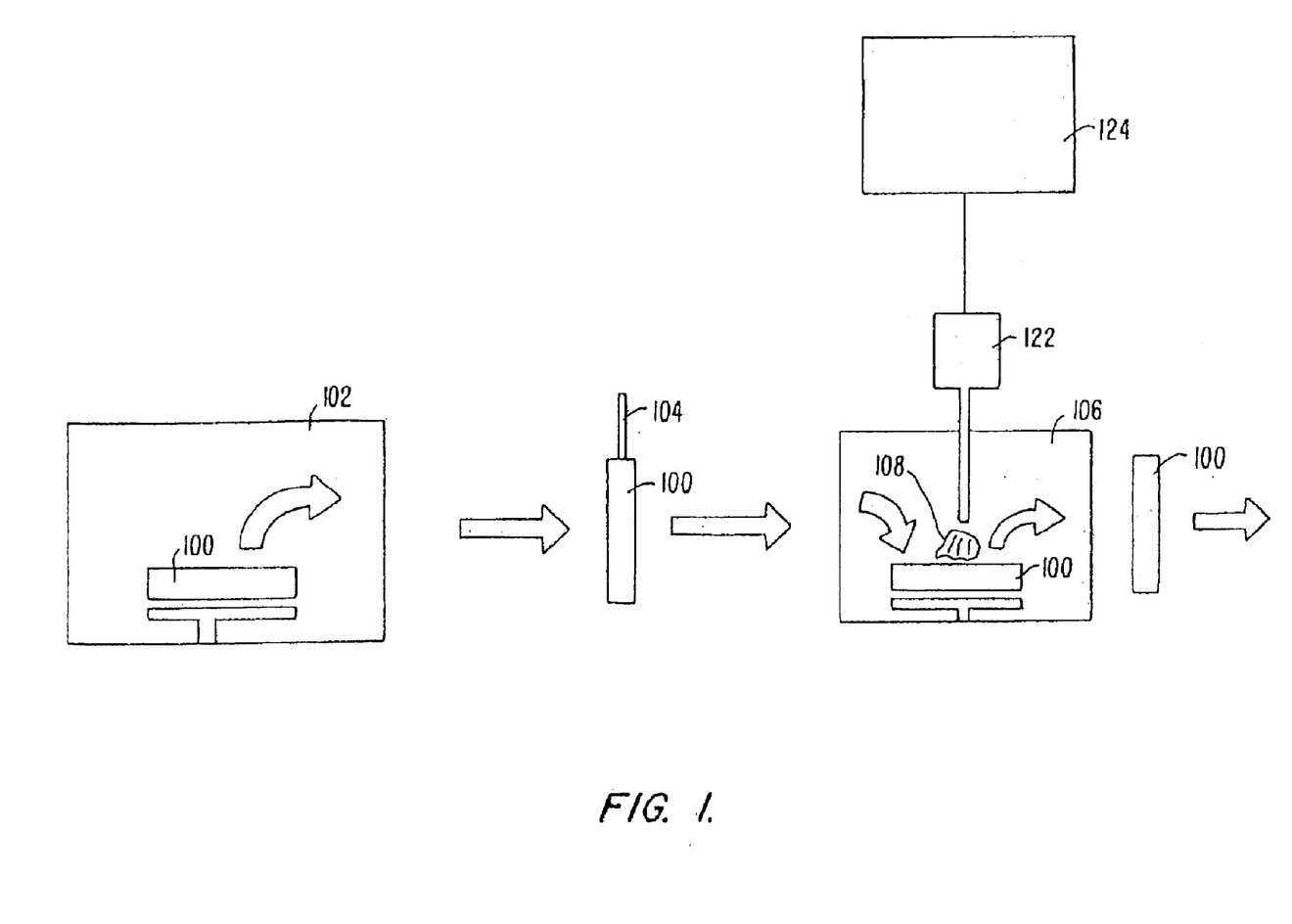
FIG. 1 is a simplified schematic view of a CMP tool and a post-CMP cleaner configured to operate in conjunction with a liquid delivery module in accordance with one embodiment of the present invention.

I. An Exemplary Post-CMP Cleaning System Configured to Practice the Present Invention FIG. 1 shows a simplified schematic view of a CMP tool and an associated wafer cleaning apparatus. The CMP tool and the wafer cleaner may be modular in design, for example the integrated MIRRA MESA™ CMP tool which includes a post-CMP wafer cleaner, manufactured by Applied Materials Inc. of Santa Clara, Calif.

As shown in FIG. 1, wafer 100 polished in CMP tool 102 is transferred by robot arm 104 to post-CMP wafer cleaner 106. Note that in FIG. 1 the CMP tool 102 and the wafer cleaner 106 are merely schematic examples, and the invention is not to be limited thereby. Any cleaner may be employed with the present invention and the cleaning step may follow a polishing step or any other step. In wafer cleaner 106, polished wafer 100 is exposed to cleaning chemistry 108 such that slurry and other polishing residues are removed. A rinsing step may follow the wafer cleaning step, prior to transfer of the cleaned and rinsed wafer 100 to the next step in the fabrication process.

Cleaning chemistry 108 is supplied to wafer cleaner 106 from liquid delivery module 122. Because liquid delivery module 122 has storage capacity for post-CMP cleaning chemistry in turn received from bulk supply 124, liquid delivery module 122 can dispense the cleaning chemistry to post-CMP cleaner 106 independent of variation in the flow of cleaning material from bulk supply 124. In accordance with an aspect of the invention, the bulk supply 124 may include two bulk supplies, each coupled via a respective liquid delivery module 122 to the same substrate processing device (such as the post-CMP cleaner 106), or to more than one substrate processing device.

Details of the design and operation of the liquid delivery module are discussed below.

II. A Pressurized Liquid Delivery Module in Accordance With One Embodiment of the Present Invention As described above, during a post-CMP cleaning process, cleaning chemistry is provided to the surface of the polished wafer from a pressurized liquid delivery module. However, the volume of the liquid delivery module is limited, and as successive polished wafers are cleaned the delivery module is refilled from the bulk cleaning chemistry supply.

To allow uninterrupted operation of the post-CMP cleaning tool and the benefit of high throughput conveyed thereby, refill of a delivery module in accordance with the present invention can occur during wafer cleaning. This is because module refill and dispense operations take place in different chambers of the module.

Figure 2:
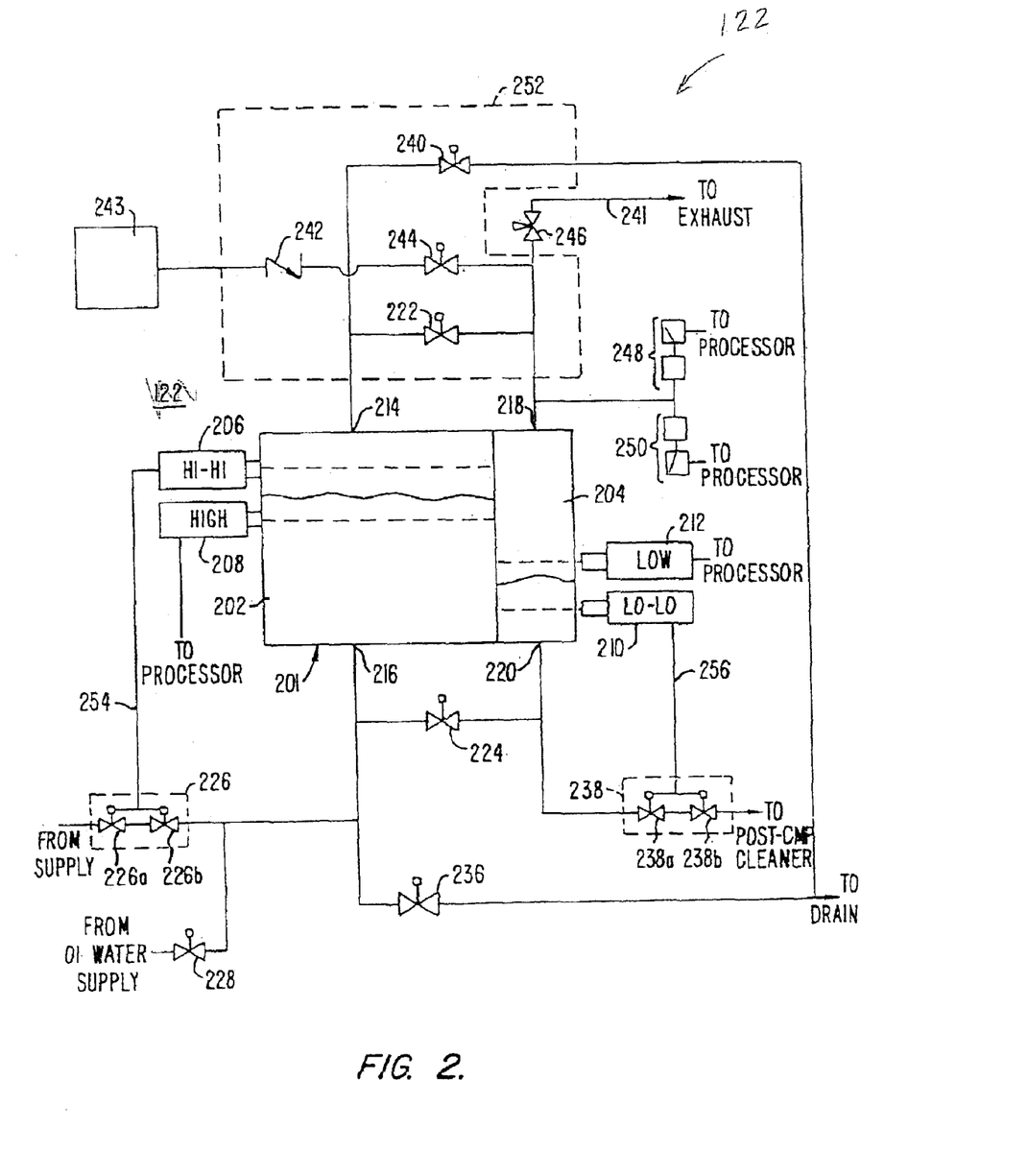
FIG. 2 is a schematic view of an embodiment of a liquid delivery module in accordance with the present invention.

FIG. 2 shows a schematic view of one embodiment of a liquid delivery module in accordance with the present invention. Liquid delivery module 122 comprises vessel 201 including first chamber 202 as well as second chamber 204. In one aspect, first chamber 202 may have a larger volume than second chamber 204. First chamber 202 includes first, "hi-hi" fluid level sensor 206 positioned above second, "high" fluid level sensor 208. Second chamber 204 includes third, "lo-lo" fluid level sensor 210 positioned below fourth, "low" fluid level sensor 212. Sufficient volume is present between third sensor 210 and fourth sensor 212 for enough cleaning liquid to clean an entire wafer. This can be used to ensure that a post-CMP wafer cleaning operation will not be interrupted if module refill is triggered just after a new wafer cleaning operation has commenced.

First, second, third, and fourth fluid level sensors 206, 208, 210, and 212 may be one of any number of different types of fluid sensing structures, including but not limited to capacitive-type fluid level sensors. The fluid level sensors may be triggered by the presence or absence of fluid at the level of the sensor.

First chamber 202 includes a top port 214 and a bottom port 216. Second chamber 204 includes a top port 218 and a bottom port 220.

First and second chambers 202 and 204 are in fluid communication with each other through their respective top ports 214 and 218 via first control valve 222. First and second chambers 202 and 204 are in fluid communication with each other through their respective bottom ports 216 and 220 via second control valve 224.

Bottom port 216 of first chamber 202 is in fluid communication with a bulk liquid supply (not shown) through supply valve 226. Supply valve 226 may actually include first supply valve 226a in series with second supply valve 226b for safety purposes.

Bottom port 216 of first chamber 202 is also in fluid communication with a deionized water supply through deionized water valve 228. Bottom port 216 of first chamber 202 is further in fluid communication with the drain (not shown) through drain valve 236.

Bottom port 220 of second chamber 204 is in fluid communication with the post-CMP wafer cleaner (not shown) through dispense valve 238. Dispense valve 238 may also include first dispense valve 238a in series with second dispense valve 238b for safety purposes.

Top port 214 of first chamber 202 is in fluid communication with the drain through vent valve 240.

Top port 218 of second chamber 204 is in fluid communication with pressurized inert gas supply 243 through check valve 242 and gas inlet valve 244. Top port 218 of second chamber 204 is also in fluid communication with exhaust port 241 through pressure relief valve 246. Pressure relief valve 246 has a set cracking pressure and is used to prevent chamber 204 from becoming overpressurized.

In addition to the mechanical pressure relief provided by pressure relief valve 246, the pressure of second chamber 204 is monitored by first pressure sensor 248 in combination with second pressure sensor 250. First pressure sensor 248 is triggered when the pressure at top port 218 exceeds a predetermined first threshold pressure. Conversely, second pressure sensor 250 is triggered when the pressure at top port 218 falls below a predetermined second threshold pressure. Both first pressure sensor 248 and second pressure sensor 250 are in communication with a processor (not shown) and warn the user through the processor of a pressure problem.

Valves 222, 240 and 244 are part of block manifold 252. Valves 222, 240 and 244 are all interlocked to a cover switch (not shown) in the module. These valves are arranged so that both sides of the valves are vented to exhaust and depressurize the vessel whenever the cover is removed for maintenance purposes.

The pressure sensors and the pressure relief valve act in tandem to control pressure within the second chamber. Specifically, the pressure sensors provide initial warning to the operator of possible pressure problems, and the pressure relief valve automatically relieves pressure after a certain pressure has been reached. This redundant feature is especially valuable in avoiding overpressurization of the delivery module.

Hi-hi sensor 206 is in direct communication with supply valves 226a and 226b through first link 254. Triggering of hi-hi sensor 206 automatically shuts off supply valve 226, such that overfilling of first chamber 202 is avoided. Similarly, lo-lo sensor 210 is in direct communication with dispense valves 238a and 238b through second link 256, such that complete draining of second chamber 204 during cleaning tool operation is avoided.

Operation of pressurized liquid delivery module 122 is now described in detail below.

III. Initial Fill State

Initially, first and second chambers 202 and 204 are empty. During an initial filling process, first control valve 222 is opened, second control valve 224 is closed, gas supply valve 244 is closed, and vent valve 240 is opened. Supply valve 226 is opened, and drain valve 236 is closed. As a result of this initial fill configuration, liquid flows from the bulk supply through supply valve 226 into bottom port 216 of vented first chamber 202 until high level sensor 208 triggers. Supply valve 226 is then closed to halt filling of the first chamber 202.

Second control valve 224 is opened to allow chamber 202 and chamber 204 to operate together as a single chamber. Fluid levels in first chamber 202 and second chamber 204 then equalize. Inert gas supply valve 244 is then opened and vent valve 240 closed, causing second chamber 204 and first chamber 202 to become pressurized. Dispense valve 238 is also opened, and as a result of the positive pressure within first vessel 202 and second vessel 204, liquid flows out of bottom port 220 of second chamber 204 through dispense valve 238 to the post-CMP cleaner. Liquid also flows directly from first chamber 202 through open second control valve 224 to the semiconductor processing tool.

IV. Refill State

In accordance with one embodiment of a method for opening the delivery module, dispensing of material to the post-CMP wafer cleaner continues until the fluid level in second chamber 204 falls below and triggers "low" sensor 212. When this occurs, the bulk liquid supply is alerted to the need to prepare additional cleaning chemistry to be provided to the delivery module 122. Both first control valve 222 and second control valve 224 are closed, and vent valve 240 is opened. As a result of this changed configuration, first chamber 202 is isolated from second chamber 204. First chamber 202 assumes ambient pressure while second chamber 204 remains pressurized. Liquid remaining in second chamber 204 continues to flow to the post-CMP wafer cleaner through dispense valve 238.

Supply valve 226 is opened and liquid flows into first chamber 202 until high fluid level sensor 208 is triggered. Once high fluid level sensor 208 is triggered, supply valve 226 is closed and vent valve 240 is closed. Dispensing of the cleaning chemistry during this module refill state continues exclusively from second chamber 204 until cleaning of the wafer in process has concluded. As described above, the spacing between low level sensor 212 and lo-lo level sensor 210 ensures that a sufficient volume of cleaning chemistry is present in the second chamber to allow completion of cleaning of the wafer present in the post-CMP cleaner when the module refill state is triggered.

Once cleaning of the wafer in the post-CMP cleaner has been completed, valves 238a and 238b are closed to halt the flow of cleaning chemistry. The wafer is rinsed and transferred to the next stage, and is replaced by a new incoming polished wafer. During this rinsing/transfer period between wafer cleaning, first and second control valves 222 and 224 are opened such that fluid is transferred from first chamber 202 to refill second chamber 204. A transitory change in pressure occurs in the first and second chambers as a result of placing the chambers back in fluid communication with one another. However, as cleaning chemistry is not being flowed to the post-CMP wafer cleaner at this time, the transitory change in pressure in chambers 202 and 204 does not adversely affect the post-CMP wafer cleaning process.

As described above, the delivery module is designed to ensure that a sufficient volume of cleaning chemistry to clean an entire wafer is available between low level sensor 212 and lo-lo level sensor 210. If for some reason however, the level of material in second chamber 204 does fall below and trigger lo-lo sensor 210, the wafer cleaning process is interrupted and the fluid level between first chamber 202 and second chamber 204 is equalized. Specifically dispense valves 238a and 238b are automatically closed. Vent valve 240 is closed. First control valve 222 and second control valve 224 are opened to equalize the level of liquid in first chamber 202 and in second chamber 204. This ensures that second chamber 204 will not run completely dry.

One feature of the embodiment of the delivery module just described is prolonged operation. Specifically, as cleaning chemistry is accessible to the post-CMP cleaning tool even during module refill, interruption of a wafer cleaning process is avoided. Another feature of the embodiment of the delivery module just described is its compact size, which makes the footprint of the delivery module as small as possible.

A further feature of this embodiment of the present invention is simplicity of structure. Specifically, the module comprises two chambers in fluid communication with each other through external valve and tubing structures. This renders the valves and connecting tubing readily accessible for repair or replacement. Another aspect of the embodiment of the present invention just described is economy of fabrication. The module comprises two chambers that communicate with each other through external links. This simplifies the structure of the vessel, and allows the delivery module to readily be fabricated in a variety of ways from a variety of materials. Of course, the material used to fabricate the vessel, tubing, and valves must be compatible with the liquid that is to be delivered.

V. Alternative Embodiments of Liquid Delivery Module

The present invention was described primarily above in connection with delivery of liquid cleaning chemistries for post-CMP wafer cleaning, but the present invention is not restricted to this particular application. A variety of other types of liquids, including but not limited to CMP slurry or undeveloped photoresist, could also be dispensed to respective semiconductor tools utilizing a delivery module in accordance with the present invention.

In addition, while the present invention has primarily been described above in conjunction with an embodiment wherein change between the non-refill state and the refill state was triggered by fluid sensors, this is not required by the present invention. In accordance with an alternative embodiment of methods of operating a dispense module in accordance with the present invention, the change between non-refill and refill states could be passively triggered on a per-wafer basis, rather than actively triggered by monitoring fluid levels within the module.

In such an alternative embodiment, after initial filling of the liquid delivery module has taken place, liquid is dispensed until refill is indicated by completion of processing of a predetermined number of wafers. In such an alternative embodiment, the number of wafers to be processed before module refill would have to be carefully evaluated by repeated operation of the semiconductor processing tool under controlled conditions. However, once consumption of liquid material on a per wafer basis is precisely established, the delivery module can be operated with sufficient confidence that it will not run completely dry.

One aspect of this alternative method of operation is higher volume operation, as maximum volumes of liquid may be rapidly dispensed by the module. However, in this alternative embodiment the faster turnover rate of liquid would result in refilling of the delivery module more often unless higher volume chambers are employed. This in turn involves more frequent venting of the first chamber, leading to potential alteration in the composition of the contents of the first chamber due to higher rates of evaporation of more volatile components of the liquid. The resulting minor but definite change in liquid composition should be considered in implementing the high volume, per-wafer refill mode of operation.

Figure 3:
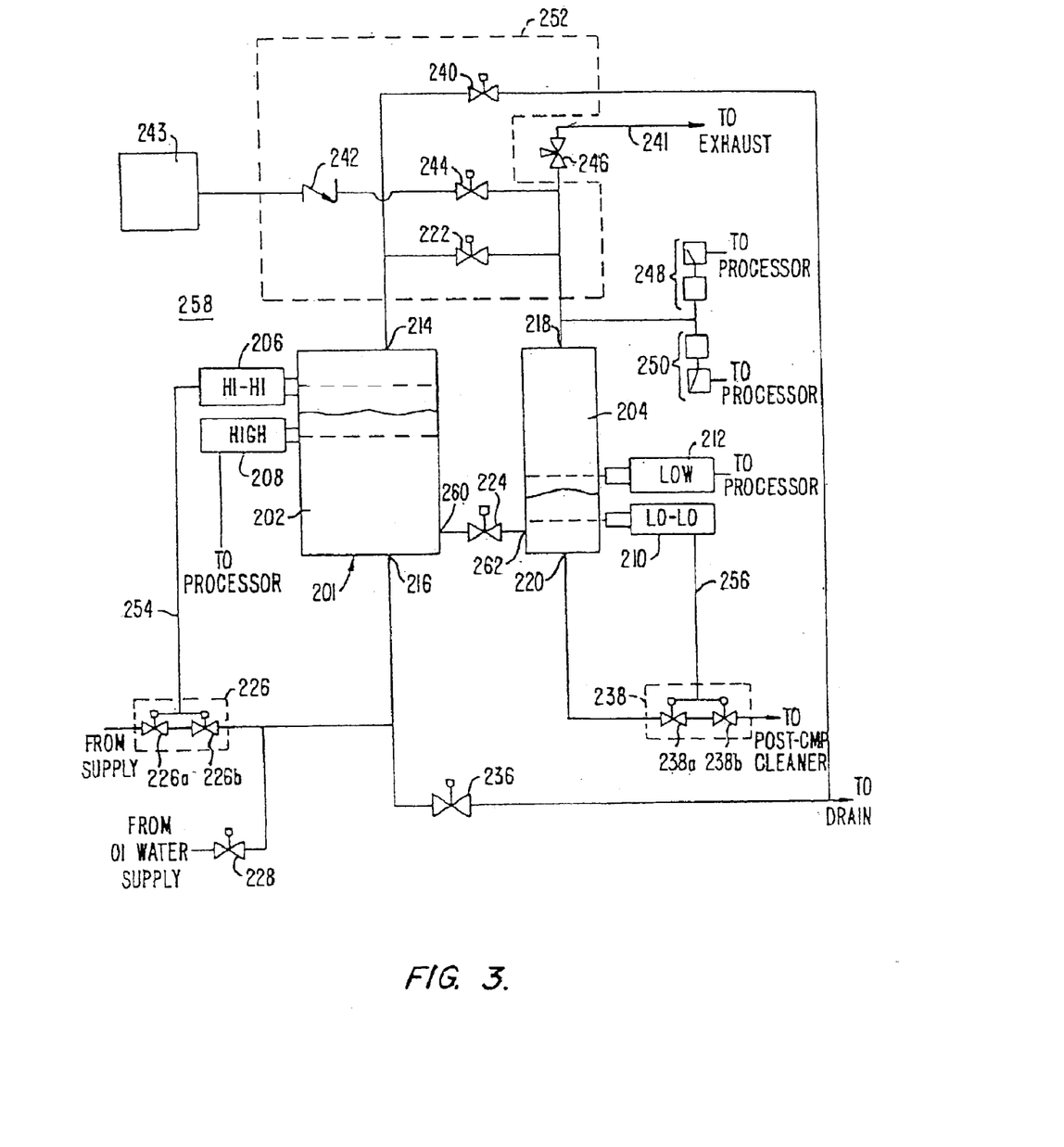
FIG. 3 is a schematic view of another embodiment of a liquid delivery module in accordance with the present invention.

While FIG. 2 provides a specific orientation of valves in accordance with one embodiment of the present invention, the present invention is not limited to this specific configuration. FIG. 3 shows the structure of an alternative embodiment of a delivery module in accordance with the present invention.

Second embodiment 258 of the pressurized delivery module features the same two-chamber structure and valve assembly as shown in the pressurized delivery module of FIG. 2, except that first chamber 202 includes a third port 260, and second chamber 204 includes a third port 262. Second control valve 224 is positioned between third port 260 of first chamber 202 and third port 262 of second chamber 204, such that all material ultimately dispensed to the semiconductor processing tool must flow through second chamber 204. This is unlike the first embodiment shown in FIG. 2, in which the material may flow directly from the first chamber to the post-CMP wafer cleaner via external second control valve 224.

The alternative module design just described would permit more rapid transfer of fluid between the chambers, owing to a more direct connection between them. Specifically, rather than requiring the flow of liquid material between the chambers to occur through external tubing and valves, flow between the chambers would occur through a valve positioned therebetween. This direct connection permits more rapid flow between the chambers, and would prevent low sensor 212 from being triggered as quickly as in the case where replenishment of the second chamber from the first chamber is delayed by indirect flow between the chambers.

Figure 3A:
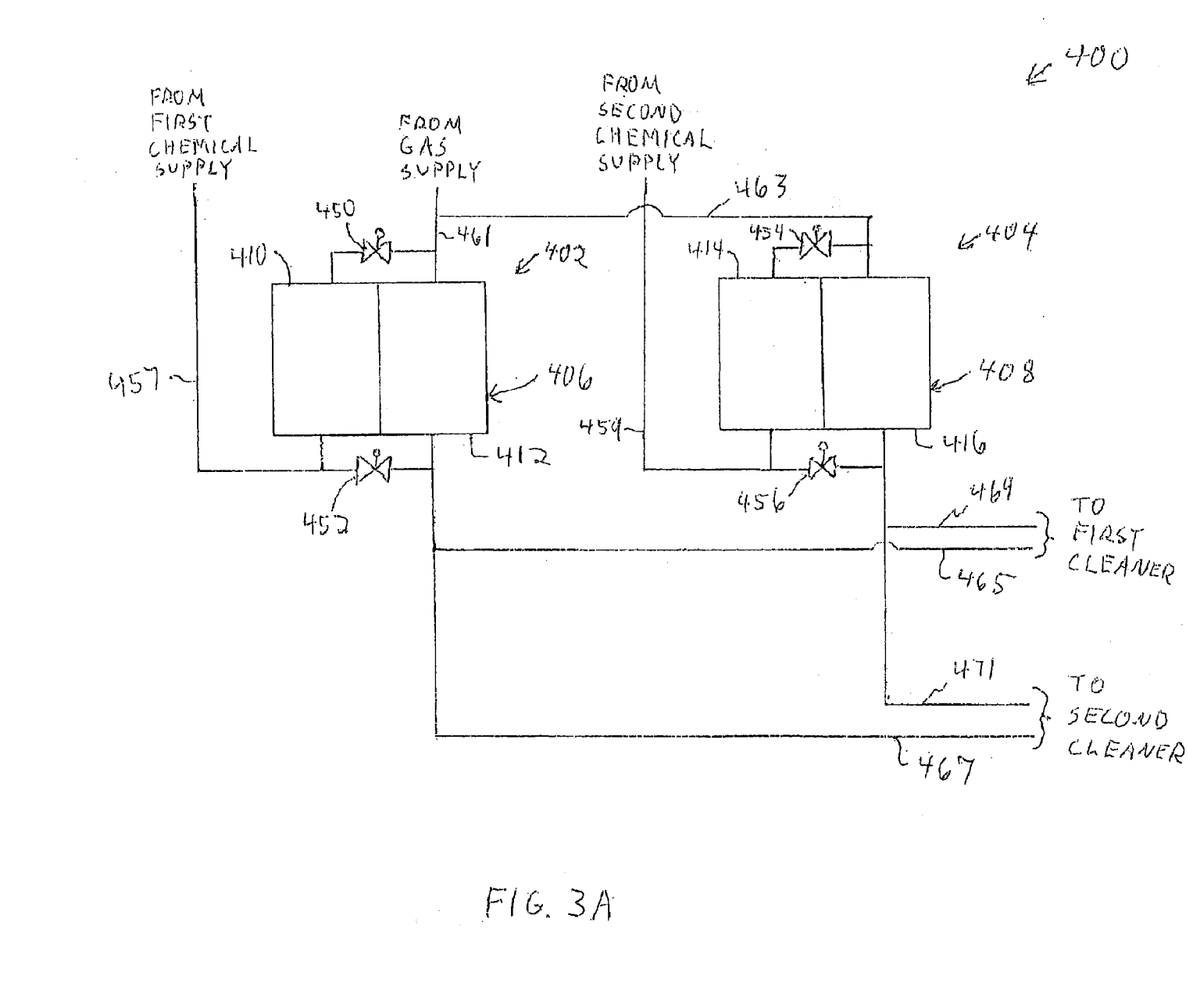
FIG. 3A is a high-level schematic diagram that illustrates an inventive liquid delivery system incorporating two inventive liquid delivery modules of the type illustrated in FIG. 2.

VI. Exemplary Liquid Delivery System Incorporating Two Liquid Delivery Modules in Accordance with the Present Invention FIG. 3A is a high-level schematic diagram that illustrates an inventive liquid delivery system 400 which incorporates two inventive liquid delivery modules of the type illustrated in FIG. 2. It will be understood that one or more of the liquid delivery modules could also be of the type illustrated in FIG. 3. The two liquid delivery modules include a first liquid delivery module 402 and a second liquid delivery module 404. The first liquid delivery module 402 includes a first vessel 406 and the second liquid delivery module 404 includes a second vessel 408. The first vessel 406 includes a main chamber 410 and a secondary chamber 412. The second vessel 408 includes a main chamber 414 and a secondary chamber 416. Control valves 450 and 452 selectively permit fluid communication between the main chamber 410 and the secondary chamber 412 of the first vessel 406 of the first liquid delivery module 402. Control valves 454 and 456 selectively permit fluid communication between the main chamber 414 and the secondary chamber 416 of the second vessel 408 of the second liquid delivery module 404.

The first vessel 406 of the first liquid delivery module 402 receives a first chemical from a first chemical supply (not shown) via a first supply line 457. The second vessel 408 of the second liquid delivery module 404 receives a second chemical from a second chemical supply (not shown) via a second supply line 459.

The first vessel 406 of the first liquid delivery module 402 and the second vessel 408 of the second liquid delivery module 404 receive a pressurized flow of gas from a gas supply (not shown) via a first pressure line 461 and a second pressure line 463, respectively.

The first vessel 406 of the first liquid delivery module 402 is coupled to a first substrate processing device (not shown), such as a first cleaner, via a first dispense line 465. The first vessel 406 of the first liquid delivery module 402 is also coupled to a second substrate processing device (not shown), such as a second cleaner, via a second dispense line 467.

The second vessel 408 of the second delivery module 404 is also coupled to the first and second substrate processing devices, via a third dispense line 469 and a fourth dispense line 471, respectively.

Figure 4A:
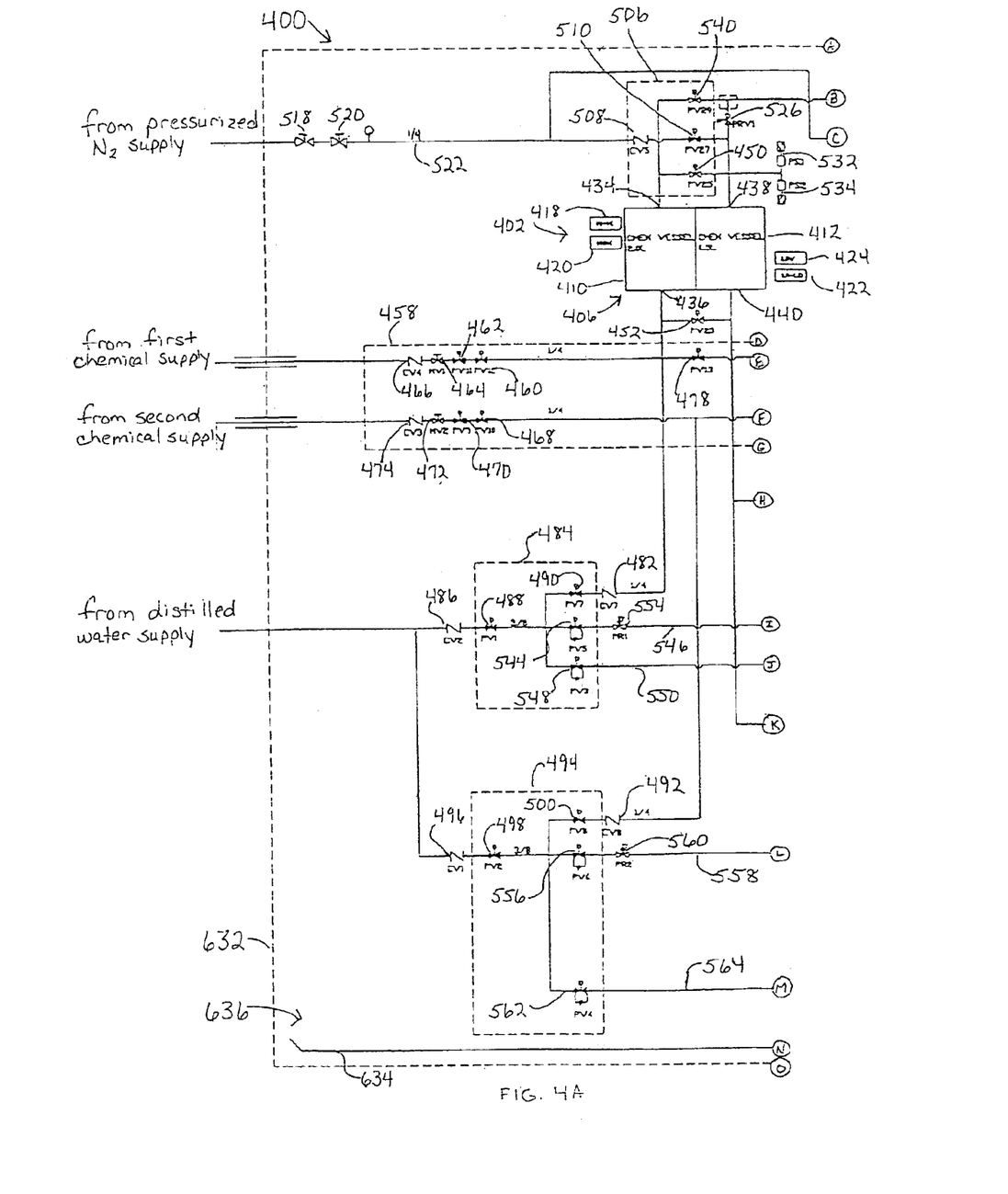
FIGS. 4A–B are a more detailed schematic diagram of the inventive liquid delivery system of FIG. 3A.
Figure 4B:
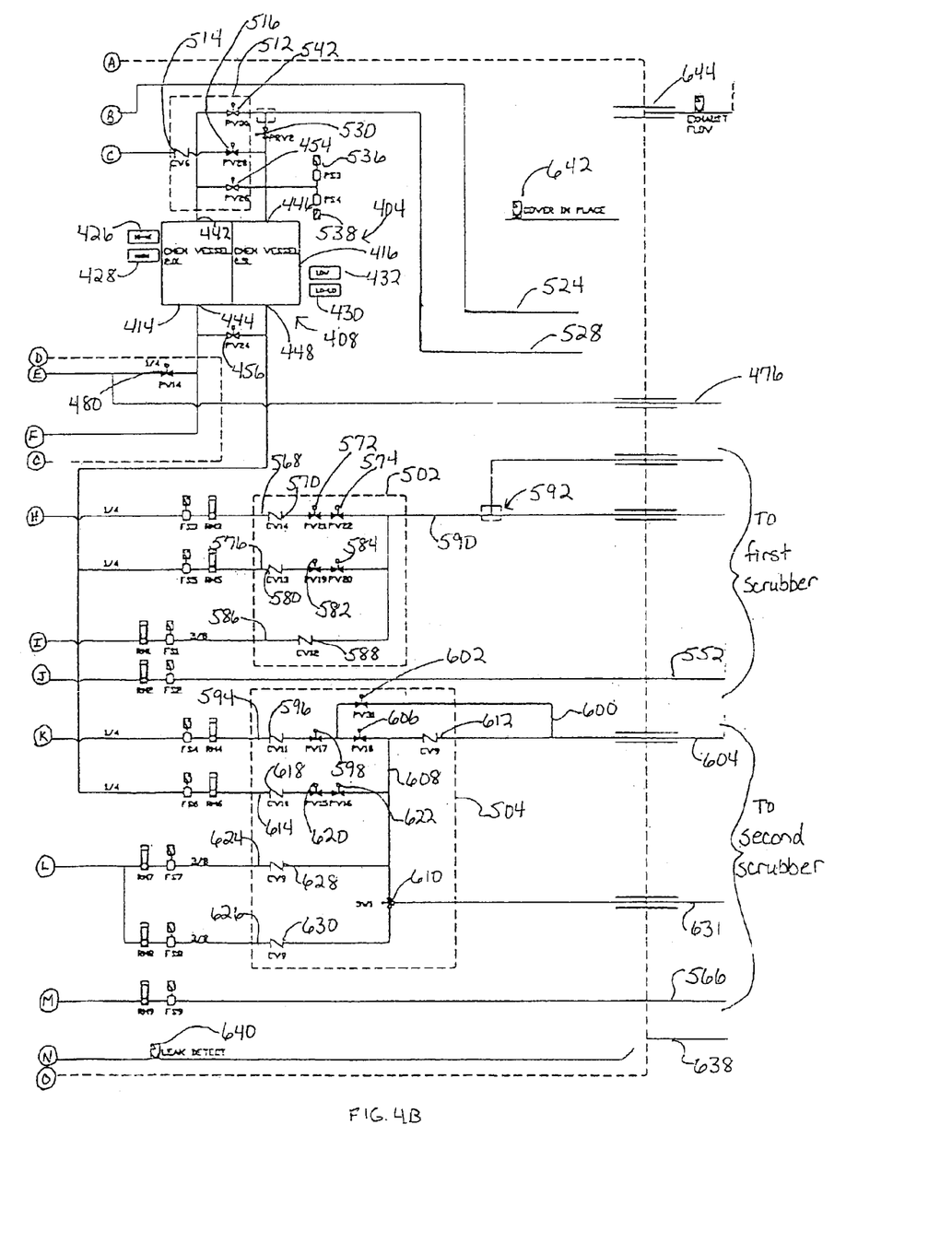

The liquid delivery system 400 may be modified to service only one substrate processing device, in which case the dispense lines corresponding to the second substrate processing device may be omitted. Also, a manifold may be included to mix the two chemicals with deionized water prior to dispensing to the substrate processing device(s). An exemplary manifold is shown and described with reference to FIGS. 4A–B. FIGS. 4A–B are a more detailed schematic diagram of the inventive liquid delivery system 400 of FIG. 3A.

FIGS. 4A–B shows the same first liquid delivery module 402 (including the first vessel 406 having the main chamber 410 and the secondary chamber 412) and the same second liquid delivery module 404 (including the second vessel 408 having the main chamber 414 and the secondary chamber 416) as are shown in FIG. 3A. The same control valves 450, 452, 454 and 456 are also shown in FIGS. 4A–B. The main chamber 410 of the first vessel 406 of the first liquid delivery module 402 may contain a larger volume than the secondary chamber 412 of the first vessel 406 of the first liquid delivery module 402, and the main chamber 414 of the second vessel 408 of the second liquid delivery module 404 may contain a larger volume than the secondary chamber 416 of the second vessel 408 of the second liquid delivery module 404.

The main chamber 410 of the first vessel 406 includes a "hi-hi" fluid level sensor 418 positioned above a "high" fluid level sensor 420. The secondary chamber 412 of the first vessel 406 includes a "lo-lo" fluid level sensor 422 positioned below a "low" fluid level sensor 424. The main chamber 414 of the second vessel 408 includes a "hi-hi" fluid level sensor 426 positioned above a "high" fluid level sensor 428. The secondary chamber 416 of the second vessel 408 includes a "lo-lo" fluid level sensor 430 positioned below a "low" fluid level sensor 432. The fluid level sensors 418–432 may have the same functions and be provided in the same manner as the corresponding fluid level sensors 206–212 discussed in connection with FIG. 2.

The main chamber 410 of the first vessel 406 includes a top port 434 and a bottom port 436. The secondary chamber 412 of the first vessel 406 includes a top port 438 and a bottom port 440. The main chamber 414 of the second vessel 408 includes a top port 442 and a bottom port 444. The secondary chamber 416 of the second vessel 408 includes a top port 446 and a bottom port 448. The main chamber 410 and the secondary chamber 412 of the first vessel 406 are in fluid communication with each other through their respective top ports 434, 438 via the control valve 450. The main chamber 410 and the secondary chamber 412 of the first vessel 406 are in fluid communication with each other through their respective bottom ports 436, 440 via the control valve 452. The main chamber 414 and the secondary chamber 416 of the second vessel 408 are in fluid communication with each other through their respective top ports 442 and 446 via the control valve 454. The main chamber 414 and the secondary chamber 416 of the second vessel 408 are in fluid communication with each other through their respective bottom ports 444, 448 via the control valve 456.

The bottom port 436 of the main chamber 414 of the first vessel 406 is in fluid communication with a first bulk chemical supply (not shown) via a supply manifold 458. The bottom port 444 of the main chamber 414 is in fluid communication with a second bulk chemical supply (not shown) via the supply manifold 458. Pneumatic valves 460, 462, manual valve 464 and check valve 466 are provided to control the flow of a first chemical from the first chemical supply to the bottom port 436 of the main chamber 414 of the first vessel 406 and are included in the supply manifold 458. Pneumatic valves 468, 470, manual valve 472 and check valve 474 are included in the supply manifold 458 to control the flow of a second chemical from the second bulk chemical supply to the bottom port 444 of the main chamber 414 of the second vessel 408. The second chemical may be different from the first chemical. Any two compatible chemistries may be employed (e.g., ammonia and surfactant).

The bottom port 436 of the main chamber 410 of the first vessel 406 is further in fluid communication with a drain 476 via a drain valve 478 included in the supply manifold 458. The bottom port 444 of the main chamber 414 of the second vessel 408 is also in fluid communication with the drain 476 through a drain valve 480 that is part of the supply manifold 458.

The bottom port 436 of the main chamber 410 of the first vessel 406 is also in fluid communication with a deionized water supply (not shown) via the supply manifold 458, a check valve 482, a first water distribution manifold 484 and a check valve 486. Pneumatic valves 488 and 490 are included in the first water distribution manifold 484 and are in the fluid communication path from the deionized water supply to the bottom port 436 of the main chamber 410 of the first vessel 406. The bottom port 444 of the main chamber 414 of the second vessel 408 is in fluid communication with the deionized water supply via the supply manifold 458, a check valve 492, a second water distribution manifold 494 and a check valve 496. The second water distribution manifold 494 includes pneumatic valves 498 and 500 which are in the fluid communication path from the deionized water supply to the bottom port 444 of the main chamber 414 of the second vessel 408.

The bottom port 440 of the secondary chamber 412 of the first vessel 406 is in fluid communication with two substrate processing devices, such as a first scrubber and a second scrubber (not shown), via a chemical mixing manifold 502 and a chemical mixing and distribution manifold 504, respectively. The bottom port 448 of the secondary chamber 416 of the second vessel 408 is also in fluid communication with the two substrate processing devices via the chemical mixing manifold 502 and the chemical mixing and distribution manifold 504, respectively.

The top port 438 of the secondary chamber 412 of the first vessel 406 is in fluid communication with a pressurized inert gas supply (not shown) such as a supply of pressurized nitrogen ($N_2$) gas, via a block manifold 506. A check valve 508 and a pneumatic valve 510 are provided in the block manifold 506 to regulate and control flow of pressurized gas to the top port 438 of the secondary chamber 412 of the first vessel 406.

The top port 446 of the secondary chamber 416 of the second vessel 408 is in fluid communication with the pressurized gas source via a block manifold 512. A check valve 514 and a pneumatic valve 516 are provided in the block manifold 512 to regulate and control flow of pressurized gas to the top port 446 of the secondary chamber 416 of the second vessel 408. (The block manifold 506 also includes the above-mentioned control valve 450, and the block manifold 512 also includes the above-mentioned control valve 452.) A manual valve 518 and a pneumatic valve 520 are provided on a gas supply line 522 that connects the pressurized gas supply with the block manifolds 506, 512.

The top port 438 of the secondary chamber 412 of the first vessel 406 is in fluid communication with an exhaust port 524 via a pressure relief valve 526. The top port 446 of the secondary chamber 416 of the second vessel 408 is in fluid communication with an exhaust port 528 via a pressure relief valve 530. The pressure relief valves 526 and 530 have set cracking pressures and are used to prevent the secondary chambers 412, 416 from becoming overpressurized.

In addition to the mechanical pressure relief provided by pressure relief valves 526, 530, the pressures of the secondary chambers 412 and 416 are monitored by pressure sensors, namely sensors 532 and 534 in the case of the secondary chamber 412 and pressure sensors 536 and 538 in the case of the secondary chamber 416. The top port 434 of the main chamber 410 of the first vessel 406 is in fluid communication with the exhaust port 524 via a pneumatic valve 540 that is included in the block manifold 506. The top port 442 of the main chamber 414 of the second vessel 408 is in fluid communication with the exhaust port 528 via a pneumatic valve 542 that is part of the block manifold 512.

The first liquid delivery module 402 and the second liquid delivery module 404 may be substantially identical to each other, and may operate in the same manner in regard to initial fill, non-refill and refill states as the liquid delivery module described above in connection with FIG. 2. The water distribution manifolds 484 and 494 will now be further described.

The first water distribution manifold 484 includes a valve 544 which controls the flow of water from the deionized water supply on a line 546 to the chemical mixing manifold 502. The first water distribution manifold 484 also includes a valve 548 which controls the flow of water through a line 550 to a brush outlet 552 from which water is delivered to one or more brushes of a first scrubber. A valve 554 that is external to the first water distribution manifold 484 also controls the line 546.

The second water distribution manifold 494 includes a valve 556 that controls a line 558 by which water is delivered to the chemical mixing and distribution manifold 504. A valve 560 that is external to the second water distribution manifold 494 also controls the line 558. The second water distribution manifold 494 also includes a valve 562 which controls a line 564 connected to a brush outlet 566 from which water is dispensed to one or more brushes of a second scrubber.

The chemical mixing manifold 502 and the chemical mixing and distribution manifold 504 will now be further described.

The chemical mixing manifold 502 includes a line 568 which receives the first chemical from the first vessel 406. A check valve 570 and pneumatic valves 572 and 574 are provided on the line 568. The chemical mixing manifold 502 also includes a line 576 which receives the second chemical from the second vessel 408. A check valve 580 and pneumatic valves 582, 584 are provided on the line 576. The chemical mixing manifold 502 also has a line 586 which receives water from the first water distribution manifold 484. A check valve 588 is provided on the line 586.

Downstream from the valves 570, 572, 574, 580, 582, 584 and 588, the lines 568, 576, 586 join together to form a common outlet line 590 which branches 592 to supply chemistry to both spray bars (not shown) of the first scrubber. The chemical mixing manifold 502 operates to mix one or both of the two chemicals with water to supply the chemistry dispensed to the spray bars of the first scrubber.

The chemical mixing and distribution manifold 504 has a line 594 which receives the first chemical from the first vessel 406. A check valve 596 and a pneumatic valve 598 are provided on the line 594. A bypass 600 having a pneumatic valve 602 connects downstream from the pneumatic valve 598 to a first spray bar outlet 604. The first spray bar outlet supplies chemistry to a first spray bar of the second scrubber. A downstream end of the pneumatic valve 598 is connected via a pneumatic valve 606 and a branch 608 to a three-way valve 610. The downstream end of the pneumatic valve 606 is also connected to the first spray bar outlet 604 via a check valve 612.

The chemical mixing and distribution manifold 504 also includes a line 614 which receives the second chemical from the second vessel 408. The line 614 connects to the branch 608 via a check valve 618 and pneumatic valves 620, 622.

The chemical mixing and distribution manifold 504 also includes a line 624 by which water is supplied from the second water distribution manifold 494 to the branch 608 and a line 626 by which water is supplied from the second water distribution manifold 594 to the three-way valve 610 by a path independent of the branch 608. Check valves 628, 630 are respectively provided on lines 624, 626. A downstream side of the three-way valve 610 is connected to a second spray bar outlet 631 from which chemistry is supplied to a second spray bar (not shown) of the second scrubber.

Figure 5:
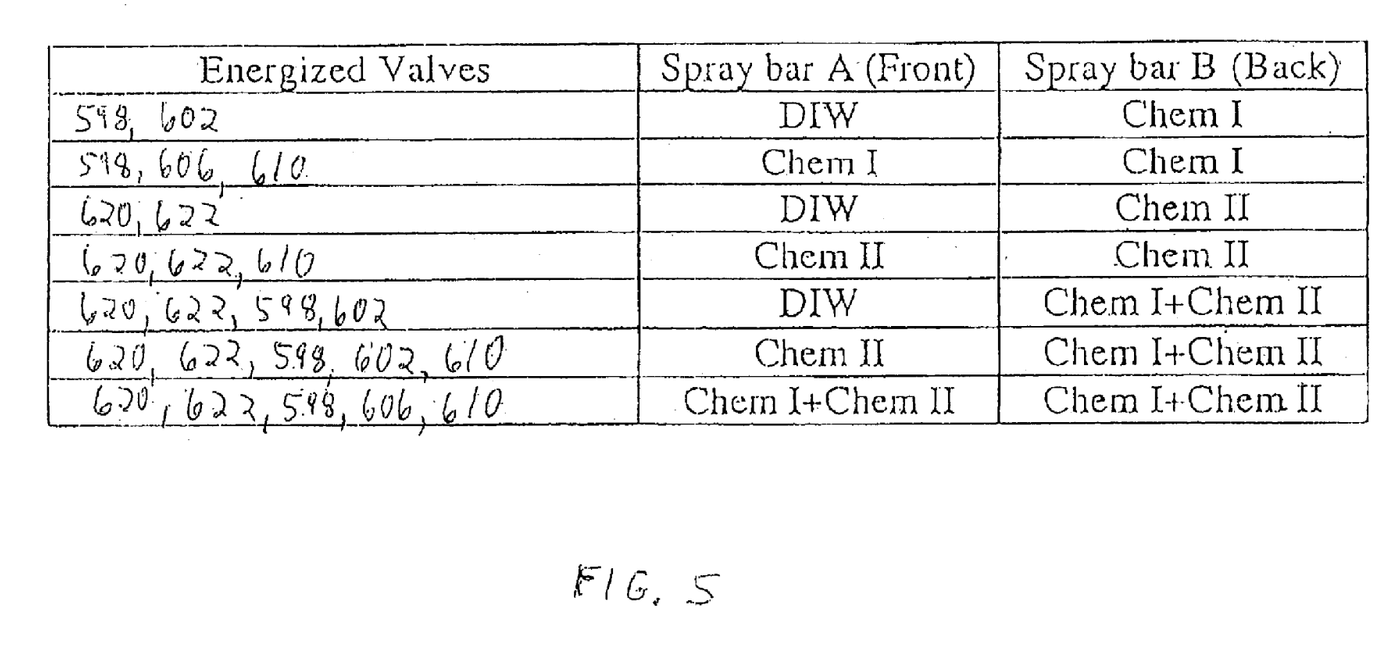
FIG. 5 is a table that illustrates various permutations of chemicals or mixtures of chemicals that can be provided to a substrate processing device by the system of FIGS. 4A–B.

Actuation of various combinations of the valves 598, 602, 606, 620, 622 and 610 allows for dispensing of various combinations of the chemicals or mixtures thereof to the spray bars of the second scrubber. FIG. 5, in tabular form, illustrates possible combinations.

All of the liquid delivery modules 402, 404, the supply manifold 458, the water distribution manifolds 484, 494, the chemical mixing manifold 502 and the chemical mixing and distribution manifold 504, and their associated connections, may be housed in a cabinet which is schematically represented at 632. A leak pan 634 is provided at a bottom 636 of the cabinet 632 to catch leaks. A cabinet drain 638 is provided to drain the leak pan 634. A leak detection sensor 640 is associated with the leak pan 634 to detect leaks in the cabinet 632. Suitable interlocks may be provided to shut down flow of chemicals and water upon detection of a leak by the leak detection sensor 640.

A cover sensor 642 is provided to determine whether a cover (not separately shown) of the cabinet 632 is in place. Again, suitable interlocks may be provided to halt the flow of chemicals and water when the cover sensor 642 senses that the cover is not in place.

An exhaust outlet 644 is coupled, via a connection which is not shown, to exhaust ports 524 and 528 to exhaust gases from the liquid delivery modules 402, 404.

Manual flow meter 645a and corresponding flow switch 645b are coupled upstream from the chemical mixing manifold 502 and distribution manifold 504 to prevent the occurrence of high chemical flow rate and low deionized water flow rate.

In operation, the liquid delivery modules 402 and 404 respectively dispense first and second chemicals during both non-refill and refill states, in the manner described in connection with FIG. 2. The first and second chemicals are supplied to the liquid delivery modules 402 and 404, respectively, via the supply manifold 458. Water is supplied by the first water distribution manifold 484, as required, to the first liquid delivery module 402, to the chemical mixing manifold 502, and directly to the brushes of the first scrubber. Water is also supplied by the second water distribution manifold 494, as required, to the second liquid delivery module 404, the chemical mixing and distribution manifold 504 and directly to the brushes of the second scrubber. The chemical mixing manifold 502 mixes either or both of the first and second chemicals with water, and supplies the resulting mixture to the spray bars of the first scrubber. The chemical mixing and distribution manifold 504 distributes a selected combination of water, the first chemical, the second chemical or mixtures thereof among the first spray bar and the second spray bar of the second scrubber.

With the inventive system of FIGS. 4A–B, two liquid distribution modules are employed that both can continue to dispense chemicals during refilling. Because two liquid distribution modules are present, a combination and/or mixture of chemicals may be provided to the cleaning apparatus served by the liquid distribution system. The liquid distribution system is capable of being compactly packaged, to conserve space in the fabrication facility.

The foregoing description discloses only the preferred embodiments of the invention; modifications of the above-disclosed apparatus and methods which fall within the scope of the invention will be readily apparent to those of ordinary skill in the art. For example, one or both of the liquid delivery modules shown in FIGS. 4A–B may be replaced with a liquid delivery module of the type illustrated in FIG. 3.

Furthermore, either the chemical mixing manifold 502 or the chemical mixing and distribution manifold 504 may be omitted from the system of FIGS. 4A–B, in which case it may be that only one substrate processing device (e.g., only one scrubber) may be serviced by the liquid delivery system 400. It is also contemplated that the chemical mixing manifold 502 may be replaced by a chemical mixing and distribution manifold like the chemical mixing and distribution manifold 504. Similarly, the chemical mixing and distribution manifold 504 may be replaced by a chemical mixing manifold like the chemical mixing manifold 502.

It is further contemplated that the manifolds 502, 504 may be modified so as to perform no mixing but rather only a connecting function relative to the liquid delivery module 402, 404 and the substrate processing devices, respectively. As another alternative, for example, the first scrubber, the chemical mixing manifold 502 and the chemical mixing manifold 504 may all be omitted, and the bottom port 440 of the secondary chamber 412 of the first vessel 406 may be directly connected to the first spray bar outlet 604 via a line controlled by a first dispense valve, and the bottom port 448 of the secondary chamber 416 of the second vessel 408 may be directly connected to the second spray bar outlet 631 via a line controlled by a second dispense valve.

The invention claimed is:

1. A liquid delivery system, comprising:
    a first liquid delivery module adapted to store and dispense a first chemical;
    a second liquid delivery module adapted to store and dispense a second chemical; and
    at least one connecting mechanism coupled to the first and second delivery modules and adapted to couple the first and second delivery modules to a substrate processing device;
    wherein each of the liquid delivery modules includes:
        a vessel including a first chamber and a second chamber, the first chamber including a first port and a second port, the vessel configured to receive a liquid from a bulk supply and to receive a pressurized flow of gas from a gas source, the second chamber configured to be in fluid communication with the substrate processing device through a first port and with a pressurized gas supply through a second port; and
        a valve assembly operable to selectively permit fluid communication between the first chamber and the second chamber during a non-refill state and to prevent fluid communication between the first chamber and the second chamber during a refill state, the valve assembly including,
            a first control valve positioned between the first port of the first chamber and the first port of the second chamber, a second control valve positioned between the second port of the first chamber and the second port of the second chamber, a material supply valve positioned between the first port of the first chamber and a bulk supply, a vent valve positioned between the second port of the first chamber and an outside environment;

such that in the non-refill state the first and second control valves are open, the material supply valve is closed, and the vent valve is closed, and in the refill state the first and second control valves are closed, the material supply valve is open, and the vent valve is open.

2. The liquid delivery system of claim 1 wherein each of the first and second liquid delivery modules further comprises:

a dispense valve positioned between the second port of the second chamber and the substrate processing device; and a first fluid level sensor positioned in the second chamber and in electrical communication with the dispense valve, such that triggering of the first fluid level sensor automatically closes the dispense valve.

3. The liquid delivery system of claim 2 wherein each of the first and second liquid delivery modules further comprises:

a processor; and a second fluid level sensor positioned in the second chamber at a level above the first fluid level sensor, the second fluid level sensor in communication with the processor such that triggering the second fluid level sensor automatically initiates a change from the non-refill state to the refill state.

4. The liquid delivery system of claim 2 wherein each of the first and second liquid delivery modules further comprises a first fluid level sensor positioned in the first chamber and in electrical communication with the material supply valve, such that triggering of the first fluid level sensor automatically closes the material supply valve.

5. The liquid delivery system of claim 4 wherein each of the first and second liquid delivery modules further comprises:

a processor; and a second fluid level sensor positioned in the first chamber at a level below the first fluid level sensor, the second fluid level sensor in communication with the processor such that triggering of the second fluid level sensor initiates a change from the refill state to the non-refill state.

6. The liquid delivery system of claim 1 further comprising a mixing manifold adapted to mix at least one of the first and second chemicals with water.

7. The liquid delivery system of claim 1 further comprising a supply manifold adapted to supply the first chemical to the first liquid delivery module and supply the second chemical to the second liquid delivery module.

8. The liquid delivery system of claim 1 further comprising:

a first water distribution manifold adapted to supply water to the first liquid delivery module; and a second water distribution manifold adapted to supply water to the second liquid delivery module.

* * * * *